US00RE41371E

(19) United States
(12) Reissued Patent
Van der Ploeg et al.

(10) Patent Number: US RE41,371 E
(45) Date of Reissued Patent: Jun. 8, 2010

(54) TWO STAGE ANALOG-TO-DIGITAL CONVERSION WITH SECOND STAGE OFFSET CORRECTION

(75) Inventors: Hendrik Van der Ploeg, Waalre (NL); Gian Hoogzaad, Mook (NL)

(73) Assignee: ST-Ericsson SA, Geneva (CH)

(21) Appl. No.: 10/923,562

(22) PCT Filed: Jul. 6, 2000

(86) PCT No.: PCT/EP00/06453

§ 371 (c)(1),
(2), (4) Date: Mar. 15, 2001

(87) PCT Pub. No.: WO01/06659

PCT Pub. Date: Jan. 25, 2001

Related U.S. Patent Documents

Reissue of:
(64) Patent No.: 6,437,717
Issued: Aug. 20, 2002
Appl. No.: 09/787,185
Filed: Mar. 15, 2001

(51) Int. Cl.
*H03M 1/10* (2006.01)

(52) U.S. Cl. ..... 341/118; 341/156

(58) Field of Classification Search ..... 341/118, 341/120, 156

See application file for complete search history.

(56) References Cited

U.S. PATENT DOCUMENTS

| | | | | | |
|---|---|---|---|---|---|
| 4,849,759 | A | * | 7/1989 | Hughes | 341/156 |
| 5,210,537 | A | * | 5/1993 | Mangelsdorf | 341/156 |
| 5,329,281 | A | * | 7/1994 | Baumgartner et al. | 341/139 |
| 5,387,914 | A | * | 2/1995 | Mangelsdorf | 341/156 |
| 5,617,473 | A | * | 4/1997 | Wietecha et al. | 379/399.02 |
| 5,675,334 | A | * | 10/1997 | McCartney | 341/118 |
| 5,812,077 | A | * | 9/1998 | Boie | 341/118 |
| 5,867,116 | A | * | 2/1999 | Nakamura et al. | 341/159 |
| 6,121,912 | A | * | 9/2000 | Brandt | 341/156 |
| 6,900,750 | B1 | * | 5/2005 | Nairn | 341/118 |

OTHER PUBLICATIONS

Moon et al., Background Digital Calibration Techniques for Pipelines ADC's, IEEE Transactions on Circuits and Systems —II: Analog and Digital Signal Processing, vol. 44, No. 2, Feb. 1997, pp. 102–109.*

"Background Digital Calibration Techniques for Piplined ADC's", by Un–Ku Moon et al., IEEE Transactions on circuits and systems, vol. 44, No. 2, Feb. 1997.*

* cited by examiner

*Primary Examiner*—Howard Williams

(57) ABSTRACT

An analog to digital converter comprises a first stage for developing a set of most significant bits from an analog input signal and for producing analog residue signals (RA, RB) corresponding to respective differences between the analog input signal and threshold values directly above and below, respectively, the analog input signal, and a second stage (AMPA, AMPB, ADC2) for developing a set of lesser significant bits from the analog residue signals (RA, RB). According to the invention, the analog residue signals (RA, RB) are reversed (CA, CB). An offset detection unit (COD, DOD) coupled to the second stage (AMPA, AMPB, ADC2) retrieves offset data representative of offset errors, and an offset correction unit (AD1, AD2, OCA, OCB) corrects the offset errors on the basis of the offset data.

7 Claims, 4 Drawing Sheets

TWO STAGE ANALOG-TO-DIGITAL CONVERSION WITH SECOND STAGE OFFSET CORRECTION

Matter enclosed in heavy brackets [ ] appears in the original patent but forms no part of this reissue specification; matter printed in italics indicates the additions made by reissue.

A popular circuit topology for realizing high-speed, high resolution Analog-to-Digital converters is based on the multi-step architecture. U.S. Pat. No. 5,210,537 describes a multistage A/D converter having two cascaded A/D stages of parallel type wherein the analog signal is compared with a set of threshold reference voltages. The first stage develops a set of most-significant bits and produces two analog residue signals: a normal residue corresponding to the difference between the analog input and the threshold voltage below the analog input, and a second residue corresponding to the difference between the analog input and the threshold voltage above the analog signal level. These two residue signals are amplified and directed to the second A/D stage. The sum of the residue signals equals one LSB of the first A/D stage, so that the two residues supply to the second A/D stage information about the quantization error of the first A/D stage as well as the quantization step size to be used to define full-scale at the second A/D stage. The second A/D stage includes a parallel converter for developing a set of less-significant bits representing the ratio of the normal residue signal to the sum of the two residue signals. The most-significant and less-significant sets of bits are combined to provide the final digital output. Errors due to inaccuracies in interstage gain are reduced due to the use of two residue signals for generating the less significant bits.

The major problem in these converters is the transition from one sub-range into another. To be monotonic by design the dual-residue principle can be used. However while this type of converter is monotonic by design the offset on the residue amplifiers still determine the integral non-linearity (INL) of the converter. For example in communication system there are high demands on the linearity (=INL) of AD-converters.

The article "Background digital calibration techniques for pipelined ADC's", by Un-Ku Moon and Bang-Sup Song, IEEE Transactions on Circuits and Systems—II: Analog and digital signal Processing, vol. 44, no. 2, Feb. 1997, pp. 102–109, describes a skip and fill algorithm to digitally self-calibrate pipelined analog to digital converters (ADC's) in real time. The technique is based on the concept of skipping conversion cycles randomly but filling in data later by non-linear interpolation. At each skipped conversion cycle, a calibration test signal is injected in place of the input signal. However, this skipping plus interpolation leads to less than optimal analog to digital conversion results.

It is, inter alia, an object of the invention to provide an improved analog to digital conversion. To this end, the invention provides an analog to digital converter as defined in the independent claim. An advantageous embodiments are defined in the dependent claim.

A primary aspect of the invention provides an analog to digital converter that comprises a first stage for developing a set of most significant bits from an analog input signal and for producing analog residue signals corresponding to respective differences between the analog input signal and threshold values directly above and below, respectively, the analog input signal, and a second stage for developing a set of lesser significant bits from the analog residue signals.

According to the invention, the analog residue signals are reversed. An offset detection unit coupled to the second stage retrieves offset data representative of offset errors, and an offset correction unit corrects the offset errors on the basis of the offset data.

These and other aspects of the invention will be apparent from and elucidated with reference to the embodiments described hereinafter.

Figure 1:
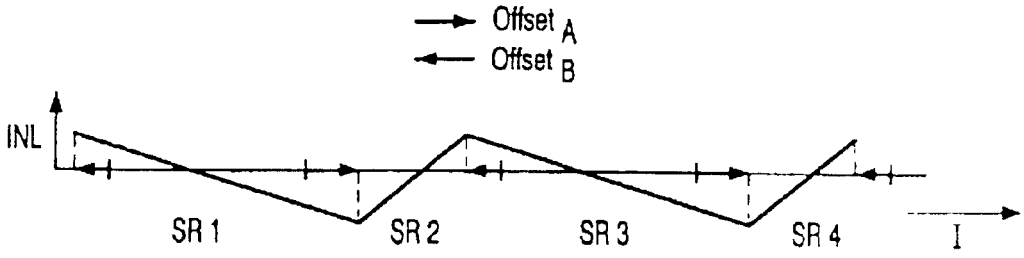
FIG. 1 shows the INL of a dual residue A/D converter with amplifier offset.
Figure 9:
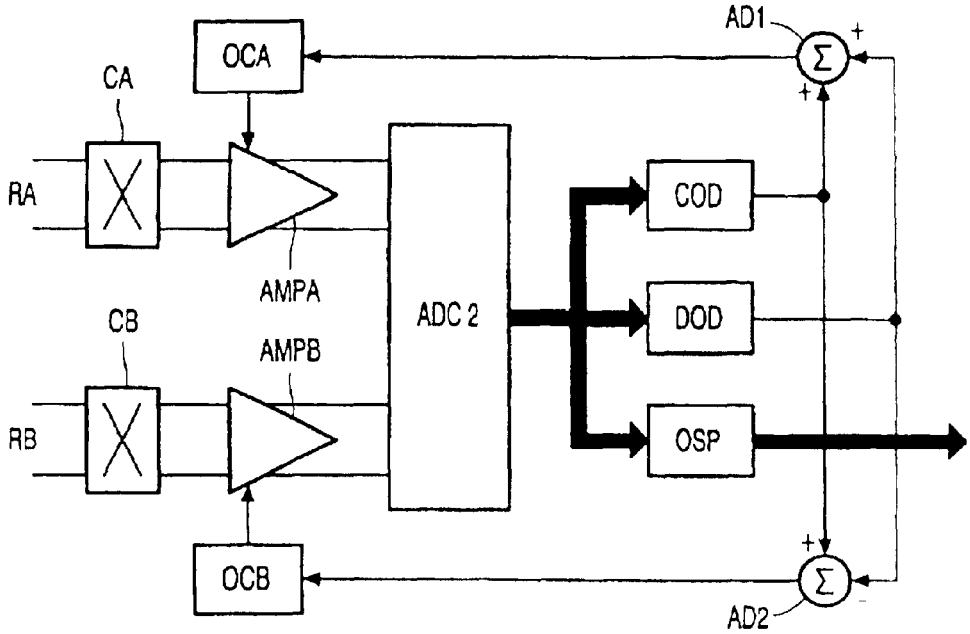
FIG. 9 shows a block diagram of an offset compensation feedback loop.

According to the present invention, the offset problem is overcome by using offset compensation in the residue amplifiers AMPA and AMPB, respectively, which are shown in FIG. 9. In a dual residue converter the INL is determined by the offset on the residue amplifiers. The INL of such an AD converter is shown in FIG. 1. The INL is indicated on the vertical axis, while the input signal I is indicated on the horizontal axis. The arrows $Offset_A$ and $Offset_B$ indicate the offsets of residue amplifiers AMPA and AMPB, respectively. SR1 to SR4 indicate four subranges of the AD converter.

The INL of the AD converter is equal to the amplifier offset divided by the LSB size. One remedy to decrease the offset on these amplifiers is to increase the transistor size that contributes to the offset. However this will decrease the speed of the AD converter. A second solution is to calibrate the amplifiers. This can be done at startup of the AD converter or by calibrating the amplifier each clock cycle. When the calibration is done at startup only the offset at that specific time is compensated. The offset can change by influence of for example temperature. If the calibration is done each clock cycle the speed of the AD converter is decreased because the input signal has to be known when the calibration is done. For example: the inputs of the amplifier are shorted for half a clock period and by measuring the output the offset is reduced. Because of these disadvantages, in accordance with the present invention a method is provided to extract the offsets $Offset_A$ and $Offset_B$ of both amplifiers AMPA, AMPB from the digital output of the converter while the AD converter is used for conversion (online calibration technique).

Figure 2:
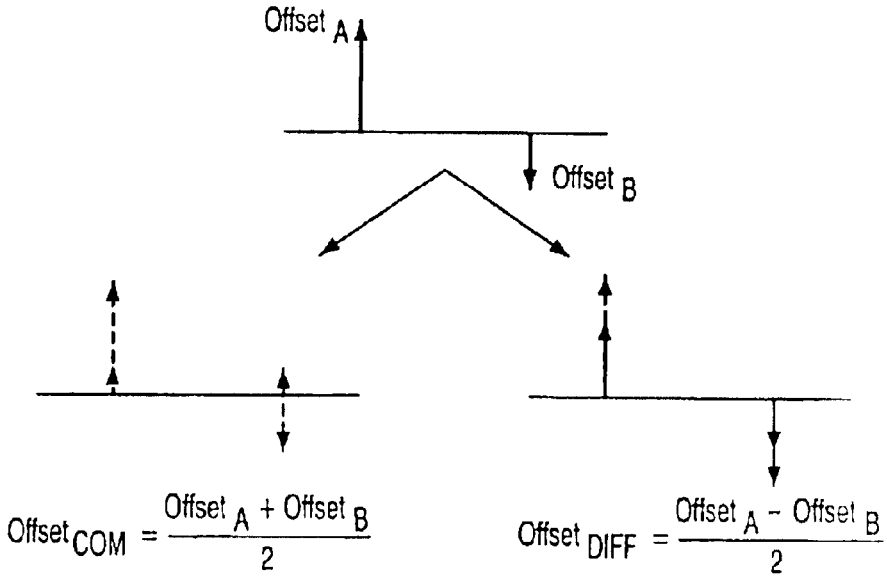
FIG. 2 illustrates an extraction of common and differential offset components.
Figure 3:
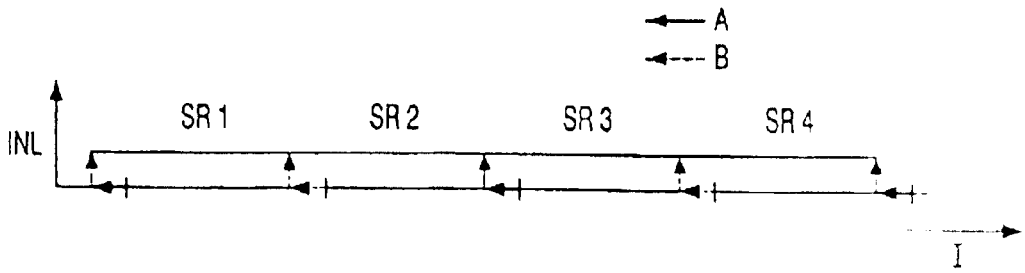
FIG. 3 shows the INL of an A/D converter with equal (=common) amplifier offsets.

Suppose that the offsets $Offset_A$ and $Offset_B$ on the residue amplifiers AMPA and AMPB have a common component $Offset_{COM}$ and a differential component $Offset_{DIFF}$. This is shown in FIG. 2. These components $Offset_{COM}$ and $Offset_{DIFF}$ are extracted from the digital output of the AD converter differently. Suppose only a common (=equal) offset on both residue amplifiers. The INL will be a straight line but not equal to zero. This is shown in FIG. 3. In the transfer function of the AD converter these amplifier offsets will only cause a DC shift and therefore these offsets can not be distinguished from the DC in the input signal.

Figure 4:
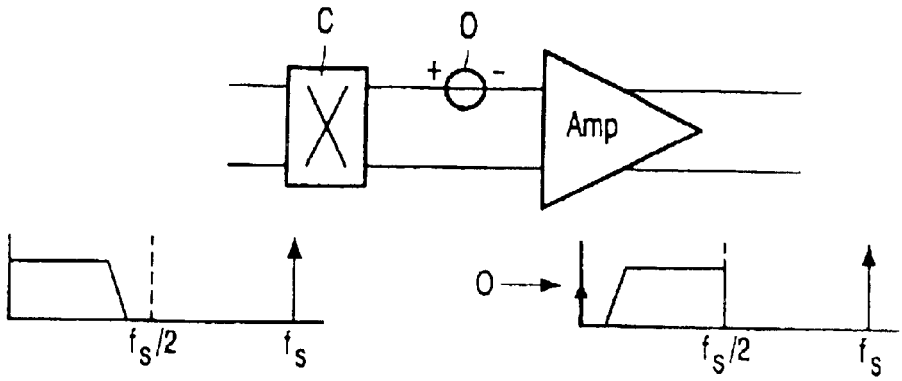
FIG. 4 illustrates chopping of the amplifier input signals and the frequency spectra.

According to the present invention, at each clock cycle the inputs of the differential amplifiers AMPA, AMPB are chopped, i.e. the amplifier inputs are interchanged. The DC component of the input signal is not at DC but at the chop frequency. Because the inputs are chopped each clock cycle, the chop frequency is equal to $f_s/2$, i.e. half the sampling frequency $f_s$) of the digitized output signal. After this chopping the offset O (which is DC) is notionally added to the signal. This is shown in FIG. 4 in which C indicates a chopping action, O indicates an offset error source, and Amp is one of the residue amplifiers.

Normally the spectrum shown at the left is converted and the spectrum in the digital domain looks the same. When the spectrum shown at the right is converted the digital signal has to be 'chopped back' to retrieve the original signal, which can be done by an EXOR function of the digital output signal of the second stage and the chop signal. As is shown in FIG. 4 the offset of the amplifiers arises at DC. When the output of the AD converter is low pass filtered only this DC signal remains in the spectrum and this is the information which can be used to reduce the offset. So, by means of chopping the offset component at DC is separated from the remainder of the signal so that the offset can be corrected without affecting the remainder of the signal.

Figure 5:
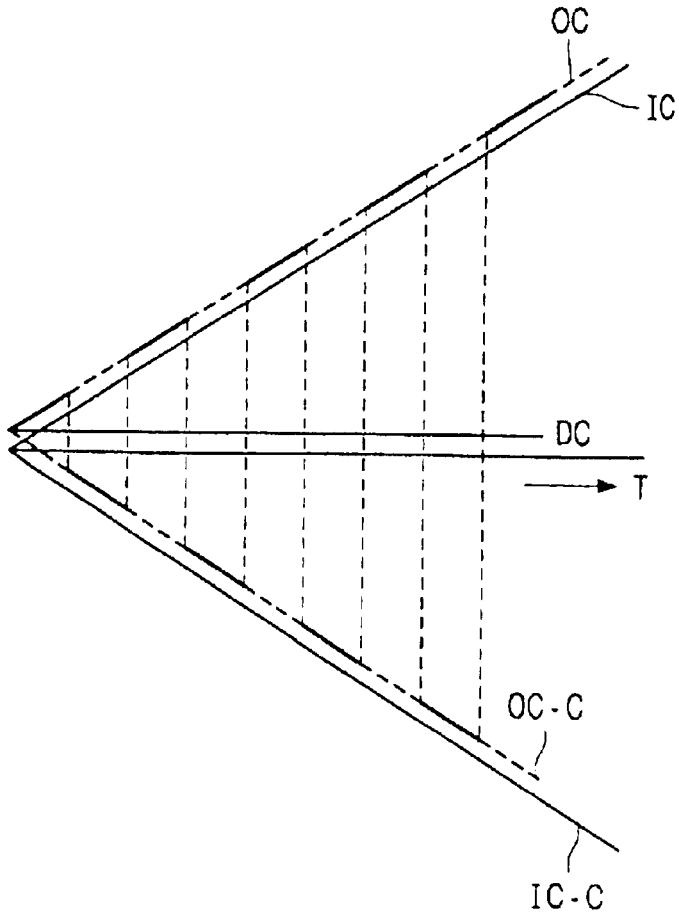
FIG. 5 illustrates the effect of chopping and retrieving the common offset after digital filtering.
Figure 10:
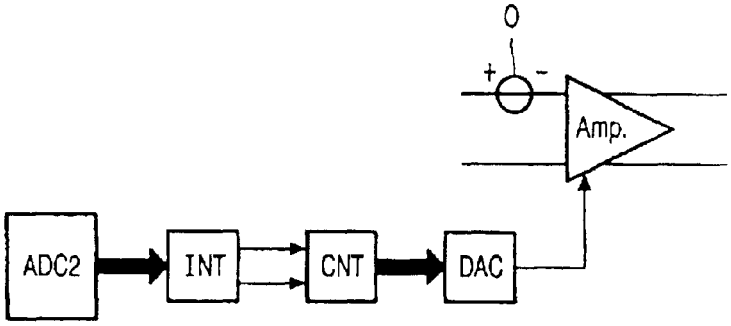
FIG. 10 shows an offset extraction with an integrator.
Figure 11:
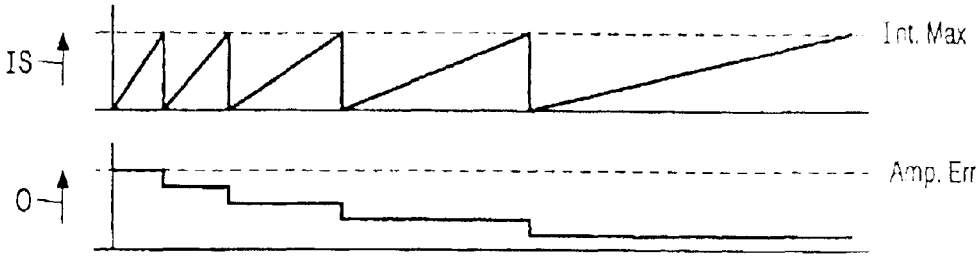
FIG. 11 shows the signal waveforms of the integration signal ($I_S$) and amplifier offset (O).

The effect of chopping on a signal that changes in time and how the common offset appears in this signal is shown in FIG. 5. In FIG. 5, OC indicates a curve with offset, IC indicates an ideal curve, DC indicates a DC component after low-pass filtering, T indicates time, OC-C indicates a chopped curve with offset, and IC-C indicates a chopped ideal curve. As shown in FIGS. 9 and 10, the low-pass filtered DC signal is used in a feedback loop to calibrate the residue amplifiers.

Figure 6:
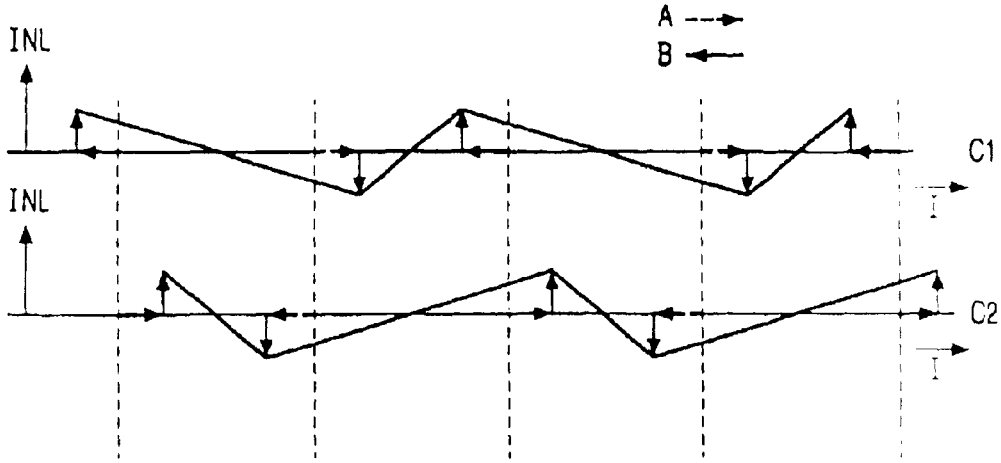
FIG. 6 shows the error (=INL) curves for the two chop states for correcting differential offset.
Figure 7:
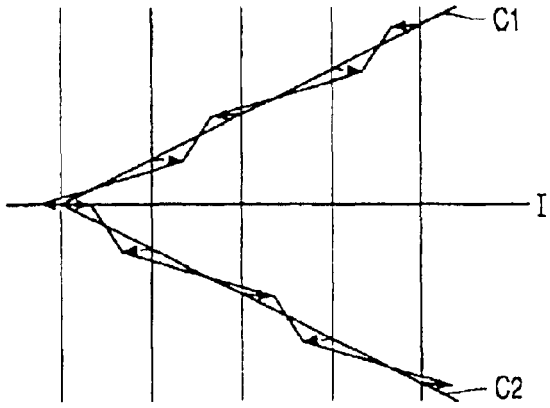
FIG. 7 illustrates the two chop states of the A/D converter for correcting differential offset.
Figure 8:
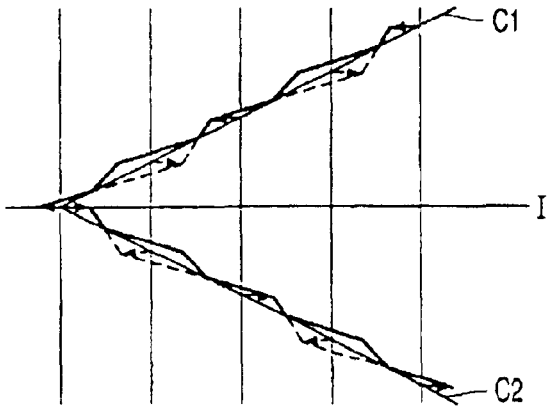
FIG. 8 shows the two subrange-dependent chop states of the A/D converter for correcting differential offset.

To extract the differential offset not only the inputs of the amplifiers have to be chopped but also in the digital domain a subrange-dependent chopping has to be done. This can be seen from the error (=INL) curves in FIG. 6. As can be seen in FIG. 6 when these chop states C1, C2 are filtered, no signal remains. This means that the DC content of error signal is zero. This is shown in FIG. 7 that shows the two chop states C1, C2 of the AD converter. By chopping the states C1 and C2 the DC content will be zero. This can be overcome by performing an extra chopping which is subrange dependent. FIG. 8 shows the same as FIG. 7, however with a subrange-dependent chopping.

If in both states the thick lines are used as transfer, the filtered signal will be larger than zero for each input signal value because the thick lines are always above the ideal transfer curve for both chop states. If the filtered signal is above zero for each input signal value, this will mean that the filtered signal will have a DC component and can be used in a feedback loop to reduce the differential offset.

A block diagram of how the feedback loops work is shown in FIG. 9. FIG. 9 shows the second half of a two-stage AD converter, the first half of which being identical to that shown on the front page of U.S. Pat. No. 5,210,537. Accordingly, residue signal lines RA carry the input signal of the first stage of the AD converter and the threshold voltage directly above this input signal, and residue signal lines RB carry this input signal and the threshold voltage directly below this input signal. New elements provided by the present invention are the chopping actions CA and CB. While the blocks CA and CB might suggest that they are embodied by separate units, this is not necessary: the chopping actions may be embodied by some other way of suitably applying the residue signals RA, RB. In FIG. 9, the amplifiers AMPA and AMPB, and a fine AD converter ADC2 more or less correspond to the prior art. An output signal processor OSP ensures that the chopping action is undone. The offset is detected by a common offset detector COD and a differential offset detector DOD, both coupled to the output of the fine AD converter ADC2. Adders AD1, AD2 apply the detected common offset $Offset_{COM}$ to offset control units OCA, OCB to correct offsets of the amplifiers AMPA, AMPB. The detected differential offset $Offset_{DIFF}$ is applied directly to the adder AD1 and, thereby, to the offset control OCA, but is applied in inverted form to the adder AD2 and, thereby, to the offset control OCB. Preferably, the offset detectors COD, DOD do not just receive the output of the fine AD converter ADC2, but the whole digitized signal also including the most significant bits generated by the first stage (not shown) of the AD converter.

In FIG. 9 it is shown that for a common detection the offset controls are corrected with the same value, a differential detection causes the offset controls to correct with an opposite value. For the offset controls for example DA converters can be used (see FIG. 10). The offset controls increase or decrease the digital input values of these DAC depending on the detection, but of course any offset control (analog or digital) can be used.

The feedback loops can operate in many ways; one example (shown in FIG. 10) is that the digital information (with the offset at DC) from the fine AD converter ADC2 is integrated on a digital integrator INT. Every time the integrator INT reaches a certain value, a counter CNT is increased (or decreased depending on the sign of the content of the integrator) and this counter is connected to a DA converter DAC as said before. When the integrator INT reaches a certain value, the contents of this integrator INT is erased and the process starts again. To speed up the calibration at start-up, the integrator INT can be made adaptive (the value to be reached can be increased during calibration). FIG. 10 also shows curves of the integrator signal IS with maximum Int.Max, and of the offset O of the amplifier with a maximum error Amp.Err that is reduced as a result of the feedback loops.

While a chop action per amplifier is illustrated, it is alternatively possible to interchange the amplifiers (which would allow to correct a gain mismatch and the differential offset) or to interchange both the amplifiers and the amplifier inputs (which would allow to correct a gain mismatch and the common offset).

Thus, according to the invention, a digital background offset extraction has been developed, by using chopping to be able to detect the offset from the output signal. This technique requires minimal analog complexity (the switches are already present for subrange selection) and is online. This with respect to prior art calibration techniques where either the AD converter is turned off for a short time for calibration or a dummy circuit is used to replace the part which is being calibrated. The presented technique is perfectly suited for a two-step AD converter but with some changes also applicable for three or more step converters which are also encompassed by the claims. As offsets are removed by the feedback loops, it is now possible to use amplifiers that have worse offset properties but that are smaller and faster so that a better AD converter is obtained.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. In the device claim enumerating several means, several of these means can be embodied by one and the same item of hardware.

What is claimed is:

1. An analog to digital converter, comprising:

a first stage for developing a set of most significant bits from an analog input signal and for producing analog residue signals [(RA, RB)] corresponding to respective differences between the analog input signal and threshold values directly above and below, respectively, the analog input signal; and a second stage [(AMPA, AMPB, ADC2)] for developing a set of lesser significant bits from the analog residue signals [(RA, RB)], wherein the analog to digital converter further comprises:

means [(CA, CB)] for reversing the analog residue signals [(RA, RB)];

offset detection means [(COD, DOD)] coupled to the second stage [(AMPA, AMPB, ADC2)] for retrieving offset data [($Offset_{COM}$, $Offset_{DIFF}$)] representative of offset errors; and offset correction means [(AD1, AD2, OCA, OCB)] coupled to receive the offset data [($Offset_{COM}$, $Offset_{DIFF}$)] for correcting the offset errors.

2. [An] *The* analog to digital converter *of claim 1*, wherein the reversing means [(CA, CB)] operate at half a sample frequency of a digital output signal of the analog to digital converter.

*3. An analog to digital converter circuit, comprising:*

*a stage for developing a set of bits from received analog signals, the stage including two residue amplifiers for amplifying the received analog signals corresponding to respective differences between an analog input signal and threshold values directly above and below, respectively, the analog input signal; and*

*wherein the analog to digital converter circuit further comprises:*

*means for reversing the received analog signals,*

*offset detection means coupled to the stage for retrieving offset data representative of offset errors and detecting the offset data from the residue amplifiers, and*

*offset correction means coupled to receive the offset data for correcting the offset errors corresponding to the detected offset data from the residue amplifiers.*

*4. The circuit of claim 3, wherein*

*the stage develops a set of least significant bits from the analog signals,*

*the offset detection means detects offset data from the least significant bits, and*

*the offset correction means corrects offset errors corresponding to the detected offset data.*

*5. The circuit of claim 3, wherein the means for reversing the analog signals includes a chopper circuit to chop incoming analog signals and to provide the chopped signals to the two residue amplifiers.*

*6. For use with an analog to digital converter that converts an analog input signal to a digital output signal, a circuit arrangement comprising:*

*a chopper circuit to chop received residue signals corresponding to respective differences between the analog input signal and threshold values directly above and below, respectively, the analog input signal;*

*amplifiers to amplify the respective chopped residue signals;*

*ana analog to digital converter circuit to convert the analog output of the amplifiers into a digital signal; and*

*a residue processing circuit to retrieve offset data representative of offset errors in the amplified residue signals and to provide a feedback control signal to the amplifiers to correct for the offset errors.*

*7. The circuit arrangement of claim 6, wherein the residue processing circuit includes a common offset detector and a differential offset detector, and provides,*

*to a first one of the amplifiers that amplifies the analog input signal and a first threshold value above the analog input signal, a feedback control signal that includes an added output from the common and differential offset detectors, and*

*to a second one of the amplifiers that amplifies the analog input signal and a second threshold value below the analog signal, a feedback control signal that includes an output from the common offset detector added to an inverted output from the differential offset detector.*

* * * * *